United States Patent [19]
McCracken

[11] 3,853,064

[45] Dec. 10, 1974

[54] METHOD OF INDUCING NEGATIVE - IMPEDANCE EFFECT, AND DEVICES BASED THEREON

[75] Inventor: Robert H. McCracken, Washington, D.C.

[73] Assignee: The United States of America as represented by the Secretary of the Army, Washington, D.C.

[22] Filed: Jan. 17, 1967

[21] Appl. No.: 609,969

[52] U.S. Cl. ........................ 102/70.2 R, 102/70.2 P
[51] Int. Cl. ........................ F42c 11/00, F42c 13/04
[58] Field of Search .................... 102/70.2, 70.2 PR; 307/251

[56] References Cited

UNITED STATES PATENTS

| | | | |
|---|---|---|---|
| 2,984,183 | 5/1961 | Hopper | 102/70.2 |
| 3,222,548 | 12/1965 | Sanford | 102/70.2 |
| 3,290,613 | 12/1966 | Theriault | 307/251 |

OTHER PUBLICATIONS

Field Effect Transistor Applications, by William Gosling, Published in 1965 by John Wiley & Sons, Inc., New York, New York, pages 18 to 20, and 119.

*Primary Examiner*—Benjamin A. Borchelt
*Assistant Examiner*—C. T. Jordan
*Attorney, Agent, or Firm*—Saul Elbaum

[57] ABSTRACT

A semiconductor is made to exhibit a negative-impedance effect by applying a radio frequency field of the proper frequency to an electrode of the semiconductor device to vary a capacitance provided by the semiconductor device at the applied radio frequency. The capacitance of the semiconductor device varying at the applied radio frequency is connected in a resonant circuit which is tuned to a frequency just above the applied radio frequency.

8 Claims, 2 Drawing Figures

INVENTOR
Robert H. McCracken

Harry M. Saragovitz,
Edward J. Kelly, Herbert Berl
& J. D. Edgerton
ATTORNEYS

METHOD OF INDUCING NEGATIVE - IMPEDANCE EFFECT, AND DEVICES BASED THEREON

This invention relates to methods of inducing negative-impedance effects in semiconductor devices and circuits utilizing negative-impendance effects, and more particularly to the inducing of a negative-impedance effect by means of an applied radio frequency and a proximity fuze utilizing the negative-impedance effect to detect the proximity of a target.

The present invention is based on the discovery that a semiconductor device can be made to exhibit a negative-impedance effect by applying a radio frequency field of the proper frequency to an electrode of the semiconductor device to thereby vary a capacitance provided by the semiconductor device at the applied radio frequency. The capacitance of the semiconductor device varying at the applied radio frequency is connected in a resonant circuit which is tuned to a frequency just above the applied radio frequency. With this arrangement, the semiconductor device will exhibit a negative-impedance effect.

In accordance with the present invention, a proximity fuze is provided making use of the above-described negative-impedance effect in a field effect transistor. When the fuze approaches the target, radio energy is reflected around a shield and applied to the field effect transistor, causing a negative-impedance effect to be induced in the field effect transistor. The negative-impedance causes oscillations in an output circuit of the field effect transistor, which oscillations fire the squib of the proximity fuze.

Accordingly, an object of the present invention is to induce a negative-impedance effect in a semiconductor device.

Another object of the present invention is to induce a negative-impedance effect in a semiconductor device by applying a radio frequency field to the semiconductor device.

A further object of the present invention is to provide a circuit utilizing a negative-impedance effect induced in a semiconductor device by a radio frequency field.

A still further object of the present invention is to provide an improved proximity fuze or proximity detector circuit.

Figure 1:
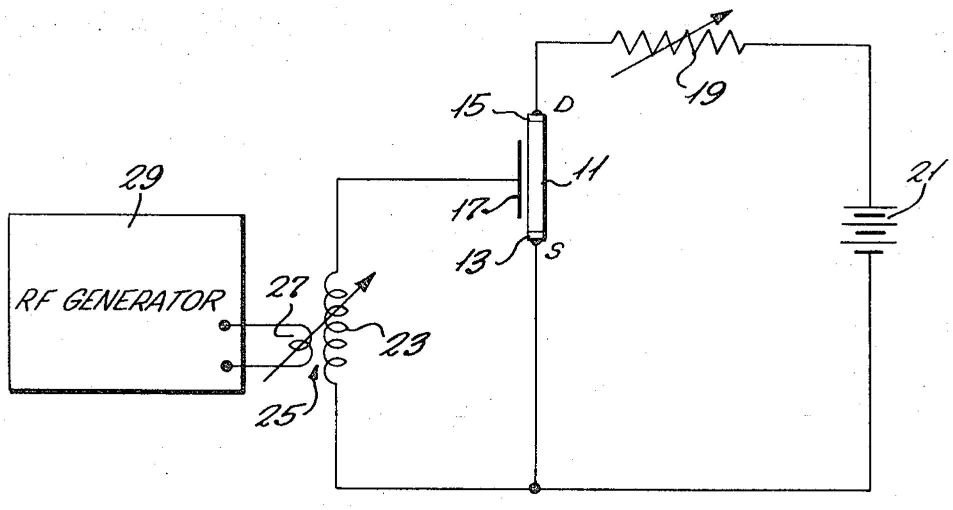
Figure 2:
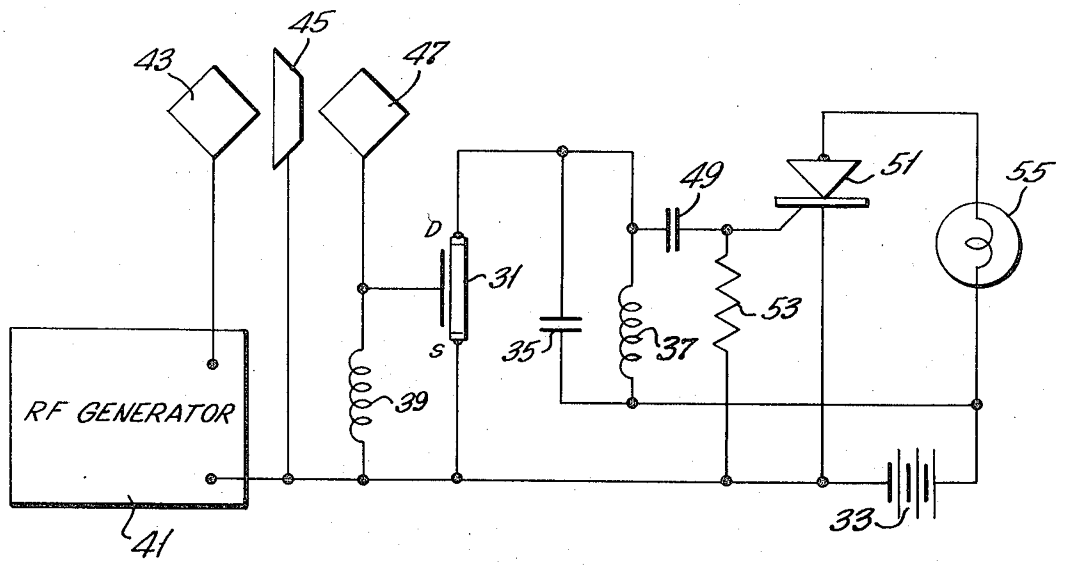

Further objects and advantages of the present invention will become readily apparent as the following detailed description of the invention unfolds, and when taken in conjunction with the drawings wherein:

FIG. 1 is a circuit diagram illustrating how a negative-impedance effect can be induced in a semiconductor device in accordance with the present invention; and FIG. 2 is a circuit diagram of a proximity fuze or proximity detector circuit in accordance with the present invention.

FIG. 1, the reference number 11 designates a field effect transistor having a source 13, a drain 15, and a gate 17. In a field effect transistor, the voltage applied to the gate of the field effect transistor controls the depth of the depletion layer formed adjacent the gate electrode, and thereby controls the conductivity of the current path between the source and drain of the field effect transistor. A capacitance exists between the gate electrode and the current path between the source and drain. The value of the capacitance depends upon the depth of the depletion layer, and therefore also depends upon the voltage applied to the gate electrode. The capacitance varies as an inverse square root function of the applied voltage. If the gate is connected directly to the source, the potential applied to the gate will follow the potential applied to the source, so that when the potential between the source and drain is increased, the thickness of the depletion layer will increase, decreasing the conductivity of the current path between the source and drain. As a result, the current flow through the field effect transistor does not change significantly for different values of source to drain voltage when the gate is connected directly to the source, and the field effect transistor will act as a constant current device. The capacitance provided between the gate electrode and the current path will vary inversely and nonlinearly with the source to drain voltage.

In the circuit of FIG. 1 which is designed to induce a negative-impedance effect in the field effect transistor 11, the field effect transistor is connected in series with the variable resistor 19 across a source of DC voltage 21. The gate 17 is connected to the source 13 through the secondary winding 23 of a radio frequency transformer 25 with variable coupling. The primary winding 27 of the transformer 25 is connected across the output of a radio frequency generator 29. Alternatively an RF field may be applied to gate 17 by immersing the inductor 23 in an RF field. The capacitance formed between the gate electrode and the current path of the field effect transistor is part of a resonant tank circuit, the inductance of which is provided by the transformer 25. The frequency of the radio frequency generator is just below the resonant value of the tank circuit.

With the transformer 25 adjusted so that no radio frequency signal is induced in the secondary winding 23, the voltage between gate 17 and source 13 will follow that between the source and drain 15, in a manner such that the current flow from source to drain through the field effect transistor will remain substantially constant as the value of the source to drain voltage is varied by varying the value of the resistor 19. With the coupling of the transformer 25 adjusted so that a radio frequency signal is induced in the secondary winding 23, this radio frequency signal will be applied to the gate 17 and thus cause the capacitance provided between the gate 17 and the current path of the field effect transistor to vary at the applied radio frequency. The capacitance provided between the gate 17 and the current path of the field effect transistor varies as an inverse square root function of the applied signal voltage, and accordingly will increase more from its equilibrium value, that is, its value with no radio frequency signal applied, than it will decrease from its equilibrium value. As a result when the radio frequency signal is applied to the gate 17, the average capacitance provided between the gate 17 and the current path between the source and drain is increased, reducing the resonant frequency of the tank circuit so it is closer to the applied frequency. As a result of this change in the average capacitance between the gate and the current path of the field effect transistor, the average potential applied to the gate of the field effect transistor is reduced and the average current through the field effect transistor is increased when the radio frequency field is applied to the gate of the field effect transistor. Thus, the application of the radio frequency field to the field effect transistor increases the average source to drain current. If the source to drain voltage is decreased with the radio frequency field applied, the capacitance provided by the field effect transistor will be increased, thus decreasing the resonant frequency of the tank circuit. As a result, the resonant frequency of the tank circuit will be nearer the applied radio frequency and a greater amount of radio frequency energy will be extracted by the tank circuit and applied to the gate electrode of the field effect transistor. Accordingly, greater swings in the cyclic variation of the capacitance of the field effect transistor will occur. As a result, the average value of the capacitance will be further increased. Accordingly, the average value of the potential applied to the gate electrode of the field effect transistor will be decreased and the average value of the current flow through the field effect transistor will be increased. Thus, it will be seen that a decrease in the source to drain voltage with the radio frequency field applied causes an increase in the average current flowing through the field effect transistor. By a similar analysis, it will be seen that an increase in the source to drain voltage while the radio frequency field is applied will cause a decrease in the average source to drain current, and thus the field effect transistor operates as a negative impedance.

The negative-impedance effect described above with respect to the field effect transistor can be induced in a similar manner in other devices such as semiconductor diodes and transistors, which include capacitive values which vary with the signal potential applied to an electrode thereof.

FIG. 2 illustrates a proximity fuze or proximity detector circuit which makes use of the negative-impedance effect described with respect to the circuit in FIG. 1. In FIG. 2 the source of a field effect transistor 31 is connected to the negative side of a battery or DC voltage source 33 and the positive side of the battery 33 is connected to the drain of the field effect transistor 31 by means of a tank circuit comprising a capacitor 35 and an inductor 37. The gate of the field effect transistor 31 is connected to the source thereof through an inductor 39. A radio frequency generator 41 produces an output signal at a frequency a little below the resonant value of the tank circuit comprising the inductor 39 and the capacitance provided in the field effect transistor 31 between the gate thereof and the conductive path between the source and drain thereof. The output signal of the radio frequency generator 41 is applied to an antenna 43 which is shielded by means of a shield 45 from a receiving antenna 47 connected to the gate of the field effect transistor 31. Normally, when the target is not near the proximity fuze, the shield 45 prevents the radio frequency signal applied to the antenna 43 from being received by the antenna 47 so that substantially no radio frequency signal is applied to the gate of the field effect transistor 31. When a target comes into proximity with the antennas 43 and 47, a portion of the radio frequency energy radiated from antenna 43 is reflected from the target to antenna 47 and applied to the gate of the field effect transistor 31, causing a negative impedance to be induced in the field effect transistor 31 as described with reference to FIG. 1. As a result of the negative impedance induced in the field effect transistor 31, the circuit will oscillate with the oscillations appearing across the tank circuit comprising the capacitor 35 and the inductor 37. The oscillations will be at the resonant frequency of capacitor 35 and inductor 37.

The drain of the field effect transistor 31 is coupled through a capacitor 49 to the gate of a silicon controlled rectifier 51, which gate is also connected to the negative side of the battery 33 through a resistor 53. The cathode of the silicon controlled rectifier is connected to the negative side of the battery 33. The anode of the silicon controlled rectifier is connected through the squib 55 of the proximity fuze to the positive side of the battery 33.

When oscillations are produced across the tank circuit comprising the capacitor 35 and the inductor 37 as a result of the negative-impedance induced in the field effect transistor 31 by the radio frequency applied to the gate thereof, these oscillations will be applied to the gate of the silicon controlled rectifier 51 through the capacitor 49 to fire the silicon controlled rectifier 51 and thus fire the squib 55. In this manner the squib 55 will be fired when a target comes into the proximity of the antennas 43 and 47.

Instead of firing a squib 55, the circuit of FIG. 2 can energize an indicator to indicate the approach of an object to the proximity of the antennas 43 and 47, in which case the circuit of FIG. 2 would be a proximity detector circuit.

The above description is of a preferred embodiment of the present invention, and many modifications may be made thereto without departing from the spirit and scope of the invention, which is defined in the appended claims.

What is claimed is:

1. A method of inducing a negative-impedance effect in a semiconductor device having a capacitance which varies with the value of a potential applied thereto comprising the steps of: connecting said capacitance in a resonant circuit, and applying to said semiconductor device a radio frequency signal having a frequency a little below the resonant frequency of said resonant circuit.

2. The method as recited in claim 1 wherein said semiconductor device is a field effect transistor.

3. An electronic circuit comprising a semiconductor device of the type which has a capacitance that varies with the value of potential applied to an electrode thereof, an inductor connected to said semiconductor device to form a resonant circuit with said capacitance, and means to apply to said electrode a radio frequency signal having a frequency a little below the resonant frequency of said resonant circuit so that said semiconductor device exhibits a negative-impedance effect.

4. An electronic circuit as recited in claim 3 wherein said semiconductor device is a field effect transistor and said electrode is the gate of said semiconductor device.

5. An electronic circuit as recited in claim 4 wherein said inductor is connected between the source and gate of said field effect transistor and said radio frequency signal is applied to the gate of said field effect transistor.

6. An electronic circuit as recited in claim 5 wherein circuit means are connected to the source and drain of said field effect transistor to cause said field effect transistor to generate oscillations when said negative-impedance effect is induced therein.

7. A proximity fuze comprising the circuit as recited in claim 6 wherein output means are provided to respond to said oscillations generated by said field effect transistor including a squib and means to fire said squib in response to said oscillations generated by said field effect transistor.

8. A proximity fuze comprising an electronic circuit as recited in claim 3 wherein there is provided a squib and means to fire said squib in response to a negative-impedance effect being induced in said field effect transistor.

* * * * *